United States Patent
Fernandez

(10) Patent No.: US 7,315,218 B1
(45) Date of Patent: Jan. 1, 2008

(54) METHOD AND APPARATUS TO CENTER THE FREQUENCY OF A VOLTAGE-CONTROLLED OSCILLATOR

(75) Inventor: Francisco Fernandez, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 49 days.

(21) Appl. No.: 11/321,386

(22) Filed: Dec. 28, 2005

(51) Int. Cl.
*G01R 23/00* (2006.01)
*H03L 7/099* (2006.01)

(52) U.S. Cl. .......................... 331/44; 331/10; 331/25; 331/36 C; 331/1 A; 331/177 V; 327/157

(58) Field of Classification Search ............ 331/10, 331/11, 16, 18, 25, 34, 36 C, 1 A, 44, 175, 331/177 V, 177 R; 327/156, 157
See application file for complete search history.

(56) References Cited

U.S. PATENT DOCUMENTS 6,545,545 B1   4/2003   Fernandez-Texon

2001/0020875 A1* 9/2001 Jansson ................. 331/44
2002/0075080 A1* 6/2002 Nelson et al. ........... 331/11
2002/0167362 A1* 11/2002 Justice et al. ........... 331/11
2005/0258906 A1* 11/2005 Su et al. .................. 331/10

\* cited by examiner

*Primary Examiner*—Benny Lee
*Assistant Examiner*—Ryan J Johnson
(74) *Attorney, Agent, or Firm*—Chapin IP Law, LLC; Barry W. Chapin, Esq.

(57) ABSTRACT

A circuit and method are provided for calibrating an analog oscillator in the digital domain. The circuit and method disclosed herein centers an oscillation frequency of an analog oscillator by producing a binary signal to which the analog oscillator is responsive. Changes in the binary digital signal cause the oscillation frequency of the analog oscillator to shift in a desired direction to calibrate the analog oscillator. At the completion of the calibration process, the control of the oscillation frequency of the analog oscillator is switched to the analog domain so that the analog oscillator is responsive to an analog control voltage to shift the oscillation frequency.

17 Claims, 9 Drawing Sheets

METHOD AND APPARATUS TO CENTER THE FREQUENCY OF A VOLTAGE-CONTROLLED OSCILLATOR

TECHNICAL FIELD OF INVENTION

The presentation invention generally relates to analog oscillator circuits, and more particularly, to the digital calibration of voltage-controlled oscillators.

BACKGROUND OF INVENTION

An analog oscillator circuit, such as a Voltage-Controlled Oscillator (VCO) receives an analog voltage signal as input to control the oscillation frequency of the oscillator. The voltage range of the control voltage received by the oscillator is limited and in recent years the voltage range of the control voltage has been reduced as circuit fabrication processes have achieved shorter channel lengths in the transistors forming some or all of the analog oscillator circuit. With such a limited control-voltage range and in order to accommodate a wide frequency range of the output of the oscillator, the oscillator is often configured to have a high frequency gain. However, such oscillators produce noisy or jittery output signals due to minor voltage shifts (i.e., noise) in the control voltage produces a change in the frequency of the output proportional to the frequency gain of the oscillator. That is, the oscillator with a large frequency gain generates larger frequency shifts for a given voltage disturbance or noise at the control voltage.

For those applications where the jitter characteristics of a high-gain oscillator are not acceptable, a low-jitter oscillator is needed such as, an LC (inductor-capacitor) voltage-controlled oscillator where the frequency is determined by the inductor and the capacitor of the circuit. However, the frequency gain or frequency range or frequency tunability of an LC VCO is limited (i.e., +/−3% over the control voltage range). Consequently, should the value of the inductance or the capacitance deviate from the expected value during the VCO manufacturing process (i.e., process variations), or deviate due to temperature variations or deviated due to supply voltage variations the oscillator will not be capable to reach the desired operation frequency because of the limited range of the control voltage acting upon the low frequency gain of the oscillator. In other words, the range of the control voltage is not sufficient to tune the oscillator to the desired frequency.

A high-frequency-gain VCO has sufficient frequency range to synthesize a desired frequency range and to tolerate variations in process parameters, temperature and voltage supply. However, the high output jitter characteristic (due to its high frequency gain among other things) of such a VCO makes it unusable for some applications. On the other hand, an LC VCO suitable for low-jitter applications has limited frequency range therefore requiring, once fabricated, calibration to compensate for the changes in VCO frequency due to process variations. However, the calibration or tuning of an analog oscillator once fabricated is difficult, inefficient, and time consuming.

SUMMARY OF INVENTION

The present invention addresses the above-described limitation of calibrating the oscillation frequency of an analog oscillator circuit. The present invention provides an approach to calibrate or center the oscillation frequency of an analog oscillator by means of a digital control signal.

In one embodiment of the present invention, a Phase Locked Looped (PLL) circuit is disclosed. The PLL circuit includes a voltage controlled oscillator (VCO) and a frequency calibration circuit. The VCO is responsive to a digital control signal received on a first input node to shift the frequency of the VCO, for example, the center frequency. The center frequency of the VCO corresponds to a midrange voltage of an analog control signal received on a second input node of the VCO. The frequency calibration circuit is responsive to a number of input signals received on a number of input nodes to drive an output node with the digital control signal. The digital control signal provides a binary value to the VCO representing an oscillating frequency, a change in the binary value results in a shift in the oscillating frequency of the VCO. It is through changes in the value of the digital control signal that the calibration circuit tunes or centers the oscillation frequency of the VCO calibrating the VCO in the digital domain.

The PLL of the present invention can include a frequency divider, a phase-frequency detector, and a charge-pump.

The frequency divider divides the frequency of the VCO output and generates a feedback signal that provides feedback to the phase-frequency detector.

The phase-frequency detector is configured to detect a frequency difference between the feedback signal produced by the frequency divider and a reference signal, a phase difference between the feedback signal produced by the frequency divider and a reference signal, or both. Further, the phase-frequency detector is configured generate an output signal at a first output node, a second output node, or both based on, the frequency difference between the feedback signal and the reference signal, the phase difference between the feedback signal and the reference signal, or both.

The charge-pump has a first input node to receive the output signal driven by the phase-frequency detector on the first output node and a second input node to receive the output signal driven by the phase-frequency detector on the second output node. The charge-pump in response to the output signal from the first output node of the phase-frequency detector can sink or source current. The charge-pump in response to the output signal from the second output node of the phase detector can sink or source current. As such, the charge-pump generates a net or effective output charge current proportional to the phase difference detected by the phase detector.

The PLL can include a loop filter configured to integrate and filter the current generated by the charge-pump to produce the analog control signal. Further, the PLL includes a switch configured to switch the VCO between a calibration mode and an operational mode.

The frequency calibration circuit includes a frequency detector, a counter, and a controller. The frequency detector is configured to detect a frequency difference between the feedback signal and the reference signal and drive an output node with an output signal, the digital control signal, representative of the detected frequency difference. The counter is responsive to the output signal of the frequency detector to generate and output the digital control signal. The controller controls operation of the frequency calibration circuit to control calibration of the VCO in the digital domain.

The frequency calibration circuit can include a clock generator configured to generate a first clock to clock the controller and to generate a second clock to clock the frequency detector.

The frequency calibration circuit can have a number of configurations and architectures. That is, the frequency calibration circuit is configurable depending on how the oscillation frequency of the VCO changes in response to the digital control signal. For example, in one configuration or mode, when the oscillation frequency of the VCO reduces in response to an increase in value of the digital control signal, the frequency calibration circuit increases the value of the digital control signal.

In another configuration or mode, when the oscillation frequency of the VCO increases in response to an increase in the value of the digital control signal, the frequency calibration circuit decreases the value of the digital control signal.

The controller of the frequency calibration circuit can include a count detector configured to disable the counter when the value of the digital control signal reaches a pre-defined value. The controller of the frequency calibration circuit can include a number of other circuits including, but not limited to a value direction reversal detector, a bypass circuit, and a calibration complete circuit. The value direction reversal detector is configured to detect a reversal in the count direction of the digital counter. That is, a reduction in the value of the digital control signal that had previously increased or an increase of the value of the digital control signal when it had previously decreased. The bypass circuit is configured to bypass the first decision of the value direction reversal detector. The calibration complete circuit is configured to detect when the calibration of the VCO completes.

In another embodiment of the present invention, a method is disclosed for calibrating a VCO. The method includes the steps of detecting a frequency difference between a frequency of a feedback signal derived from the output signal of the VCO and a frequency of a reference signal and changing a count of a counter based on the frequency difference. The method also includes the step of halting calibration of the VCO when the count equals a predetermined value or when the change to the count would cause a reversal in a count direction of the counter. The method can include the step of changing a capacitance value of the VCO based on the count of the counter. The method can also include the step of initializing calibration of the VCO and the step of bypassing the step of halting.

In one embodiment of the present invention, a calibration circuit for calibrating an analog oscillator circuit in a digital domain is disclosed. The calibration circuit includes an input circuit and output circuit. The input circuit initializes calibration of the analog oscillator circuit in the digital domain and outputs a digital output signal representing a digital value of a comparison between a frequency of a reference signal received on a first input node and a frequency of a feedback signal from the analog oscillator circuit received on a second input node. The output circuit is responsive to the digital output signal to change a digital value of a calibration signal generated by the output circuit. The value of the digital calibration signal changes an electrical characteristic of the analog oscillator circuit from the digital domain to calibrate the analog oscillator circuit. The calibration circuit can include a controller configured to halt calibration when either the value of the calibration signal reaches a predetermined value or a change in count direction of the value of the calibration signal would occur.

BRIEF DESCRIPTION OF THE DRAWINGS

An illustrative embodiment of the present invention will be described below relative to the following drawings.

DETAILED DESCRIPTION

The illustrative embodiment of the present invention provides a frequency calibration circuit to calibrate an analog based oscillator in the digital domain. The illustrative embodiment of the present invention switches the analog oscillator from an operational mode in the analog domain to a calibration mode in the digital domain to calibrate or center an oscillation frequency of the oscillator. Accordingly, the oscillator in the operational mode is responsive to an analog control voltage and in the calibration mode is responsive to a binary signal.

The present invention reduces the amount of frequency adjustment that the analog control voltage has to execute since the oscillation frequency of the oscillator after calibration is at the center of the analog control voltage range. As such, after calibration of the oscillator, changes in oscillation frequency of the oscillator due to temperature and voltage supply variations are accountable through adjustment of the analog control voltage.

The illustrative-embodiment of the present invention accounts for process variations in element values introduced during fabrication of the oscillator. To account for the process variations, the present invention provides a calibration circuit architecture and methodology to calibrate an analog oscillator in the digital domain to effectively null any effects of the process variations so that they do not detract from the ability of the oscillator to maintain a desired frequency range.

Figure 1:
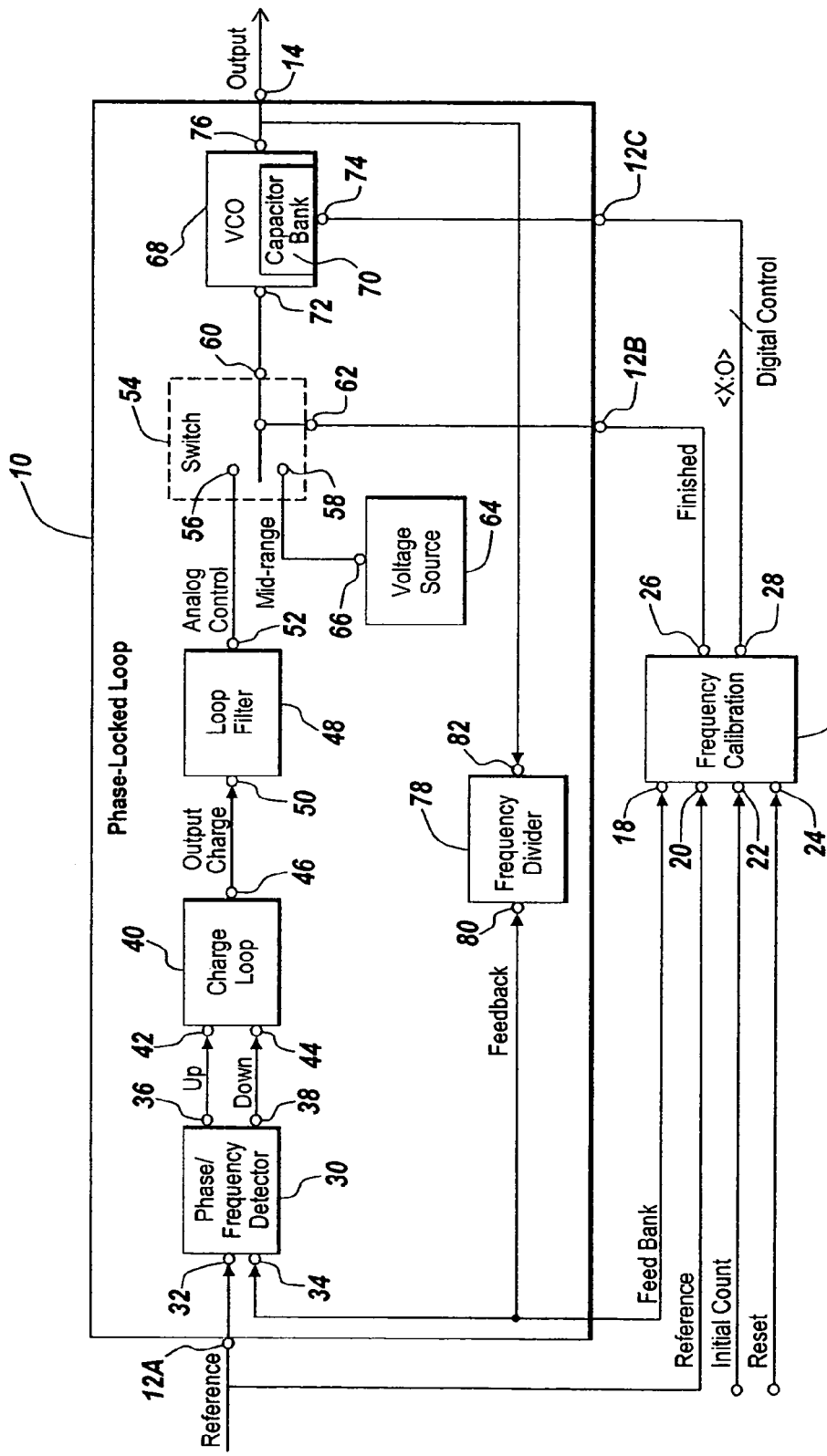
FIG. 1 illustrates a block diagram of a phased locked loop circuit and a frequency calibration circuit according to the teachings of the present invention.

FIG. 1 is a block diagram of an analog oscillator circuit and a frequency calibration circuit suitable for practicing the illustrative embodiment of the present invention. In the illustrative embodiment of the present invention, the analog oscillator circuit is configured as a VCO, which is illustrated as a component of a phased locked loop (PLL) 10. The PLL 10 includes a first input node 12A to receive a reference signal, a second input node 12B to receive a calibration finished signal, a third input node 12C to receive a digital control signal, and an output node 14 to output a periodic output signal from a VCO 68. The PLL 10 includes a phase frequency detector 30, a charge-pump 40, a loop filter 48, a switch 54, a voltage source 64, the VCO 68, and a frequency divider 78.

The phase frequency detector 30 includes a first input node 32 to receive the reference signal and a second input node 34 to receive a feedback signal from the VCO 68. The phase frequency detector 30 includes a first output node 36 and a second output node 38. In operation, the phase frequency detector 30 compares the reference signal received on the fist input node 32 and the feedback signal received on the second input node 34 and generates either an "UP" pulse or a "DN" pulse based on the comparison. The difference in width of the "UP" and "DN" pulses represent the direction and magnitude of the input phase error detected by the phase frequency detector 30 between the reference signal and the feedback signal. The phase frequency detector 30 drives the first output node 36 with the "UP" pulse and drives the second output node 38 with the "DN" pulse.

Those skilled in the art will appreciate the phase frequency detector 30 is configurable to include a number of architectures so that in various embodiments of the present invention the manner in which the phase frequency detector 30 senses the difference between the two input signal is different. As such, the target input phase difference that causes the phase frequency detector 30 to detect no phase error is configurable and how the phase frequency detector 30 represents any phase error in the output pulses is likewise configurable. For example, the phase frequency detector 30 is configurable as either rising or falling edge sensitive and for each pair of input signal edges produces a single output pulse at either the first output node 36 or the second output node 38, depending on which edge arrives first, with a duration equal to the time difference between the two edges or equivalently the input phase difference.

Thus when a reference signal edge and a feedback signal edge arrive at the same time for zero input phase difference the phase frequency detector 30 will effectively generate no "UP" or "DN" pulse. However, in actuality, the input phase difference may be represented by the phase frequency detector 30 as the difference between an "UP" pulse and a "DN" pulse where both pulses are asserted for some minimum duration in order to guarantee that no error information is lost due to incompletely rising signal edges at the inputs to the phase frequency detector 30 as the input phase difference approaches zero.

The charge-pump 40 includes a first input node 42 to receive the "UP" signal and a second input node 44 to receive the "DN" signal. The charge-pump 40 includes an output node 46 to output the current charge generated. The charge-pump 40 sources or sinks current for the duration of the "UP" and "DN" pulses from the phase frequency detector 30 and the net output charge of the charge-pump 40 is proportional to the difference between the "UP" and "DN" pulses. The charge-pump 40 drives the loop filter 48.

The loop filter 48 includes an input node 50 to receive the output charge from the charge-pump 40 and converts the output charge into an analog control voltage. The loop filter 48 includes an output node 52 to output the analog control voltage and drive the VCO 68 with the same. In turn, the VCO 68 generates an oscillation frequency proportional to the analog control voltage. Those skilled in the art will appreciate the loop filter 48 is configurable to include a single node that acts as an input and output node.

The voltage source 64 includes an output node 66. The voltage source 64 generates a midrange analog control signal equal to the midrange value of the analog control voltage produced at node 52 of the loop filter 48 by the charge injected by the charge-pump 40. The midrange control signal is used during calibration of the VCO 68 and will be discussed below in more detail.

The switch 54 includes a first input node 56 to receive the analog control voltage produced by the loop filter 48 and a second input node 58 to receive the midrange control voltage produced by the voltage source 64. The switch 54 includes a third input node 62 to receive a digital control signal such as the finished signal from the frequency calibration circuit 16. The switch 54 also includes an output node 60 to connect either the first input node 56 or the second input node 58 to the VCO 68.

The VCO 68 includes a first input node 72 to receive either the analog control voltage or the midrange control voltage and an output node 76 in communication with the output node 14 of the PLL 10 to output a periodic signal. The VCO 68 includes a second input node 74 to receive a digital control signal produced by the frequency calibration circuit 16 to calibrate the VCO 68 in the digital domain. In one embodiment of the present invention, the VCO 68 is an inductor-capacitor (LC) type VCO and includes a capacitor bank 70 for controlling the oscillation frequency of the VCO. The VCO 68 generates an output signal asserted on output node 76 having a frequency proportional to the analog control signal, the midrange control signal, or both.

The frequency divider 78 includes an input node 82 to receive the output signal generated by the VCO 68 as part of a feedback loop and an output node 80 to provide the feedback signal to the second input node 34 of the phase frequency detector 30. The feedback signal is also received by the frequency calibration circuit 16, which is discussed below in more detail. The frequency divider 78 divides the frequency of the output signal produced by the VCO 68 by "N" to produce the feedback signal on output node 80. Those skilled in the art will appreciate the frequency divider 78 may be optional and further appreciate the frequency divider 78 allows the output signal at output node 14 of the PLL 10 to be "N" times higher in frequency than the frequency of the reference signal or the feedback signal, thus allowing the PLL 10 to perform frequency multiplication.

The frequency calibration circuit 16 includes a first input node 18 to receive the feedback signal produced by the frequency divider 78, a second input node 20 to receive the reference signal, a third input node 22 to receive an initial count signal, and a fourth input node 24 to receive a reset or initialize signal. The frequency calibration circuit 16 includes a first output node 26 to output a first digital control signal such as the finished signal and includes a second output node 28 to output a second digital control signal such as the digital control signal to calibrate the VCO 68 in the digital domain. The frequency calibration circuit 16 controls whether the VCO 68 is in an operational mode or a calibration mode and when the VCO 68 is in the calibration mode the frequency calibration circuit 16 adjusts or shifts the oscillation frequency of the VCO 68 such that once calibration is complete the target oscillation frequency corresponds to the midrange of the analog control voltage received at the node 72. The target oscillation frequency is also known as the center frequency because it is associated with the midrange or center of the range of the analog control voltage produced by the loop filter 48.

In operation, to calibrate the VCO 68 the frequency calibration circuit 16 triggers the switch 54 to switch from the first input node 56 to the second input node 58 to couple the first input node 72 of the VCO 68 with the voltage source 64. The voltage source 64 generates a voltage equal to the midrange of the analog control voltage. Thus, once calibration completes, the target frequency corresponds to the midrange of the analog control signal produced by the loop filter 48.

The frequency calibration circuit 16 controls operation of the switch 54 with the finished signal output on the first output node 26. The finished signal can be a binary signal with either a logic "1" value or a logic "0" value. The value of the finished signal indicates to the switch 54 when to switch between a calibration mode when the first input node 58 is coupled to the output node 60 and in operational mode when the first input node 56 is coupled to the output node 60.

In calibration mode, changes in the value of the digital control signal produced by the frequency calibration circuit 16 cause the addition or removal of capacitors in the VCO 68 from the capacitor bank 70. In turn, the output frequency of the output signal produced on the output node 76 by the VCO 68 has a corresponding frequency shift and the frequency calibration circuit 16 compares the frequency of the feedback signal produced by the frequency divider 78 with the reference signal received on the second input node 20 to determine whether the binary value of the digital control signal should be increased, decreased, remain the same, or if calibration is complete and if switch 54 should be commanded to couple the first input node 56 to the output node 60 to return the VCO to the operational mode and end calibration of the VCO 68. The frequency calibration circuit 16 calibrates the VCO 68 in the digital domain by providing the VCO 68 with a digital control signal to command the VCO 68 to increase or decrease an amount of capacitance until the VCO frequency at node 14 equals or substantially equals the target frequency or "N" times the frequency of the reference signal at node 12A.

In this manner, any fabrication process variations that effected the values of the elements forming the VCO 68 that change the oscillation frequency of the VCO from a target value no longer require compensation through changes in the analog control voltage at node 52. That is, the digital control signal effectively accounts for or nullifies such fabrication process variations during the calibration process. As such, the analog control voltage produced by the loop filter 48 has sufficient range to cope with frequency variations due to variations in supply voltage and temperature. Consequently, an analog oscillator tuned or calibrated in accordance with the teachings of the present invention is able to have a low frequency gain (i.e., the frequency change per analog control voltage change "Hertz/Voltage") reducing the susceptibility of the of the VCO 68 to noise injected in the analog control voltage and, in turn, produce a periodic output signal with decreased jitter and decreased phase noise. Moreover, in accordance with the present invention, the frequency calibration circuit 16 is able to calibrate the VCO 68 without the phase frequency detector 30, the charge-pump 40, and the loop filter 48 in the calibration loop.

Figure 2:
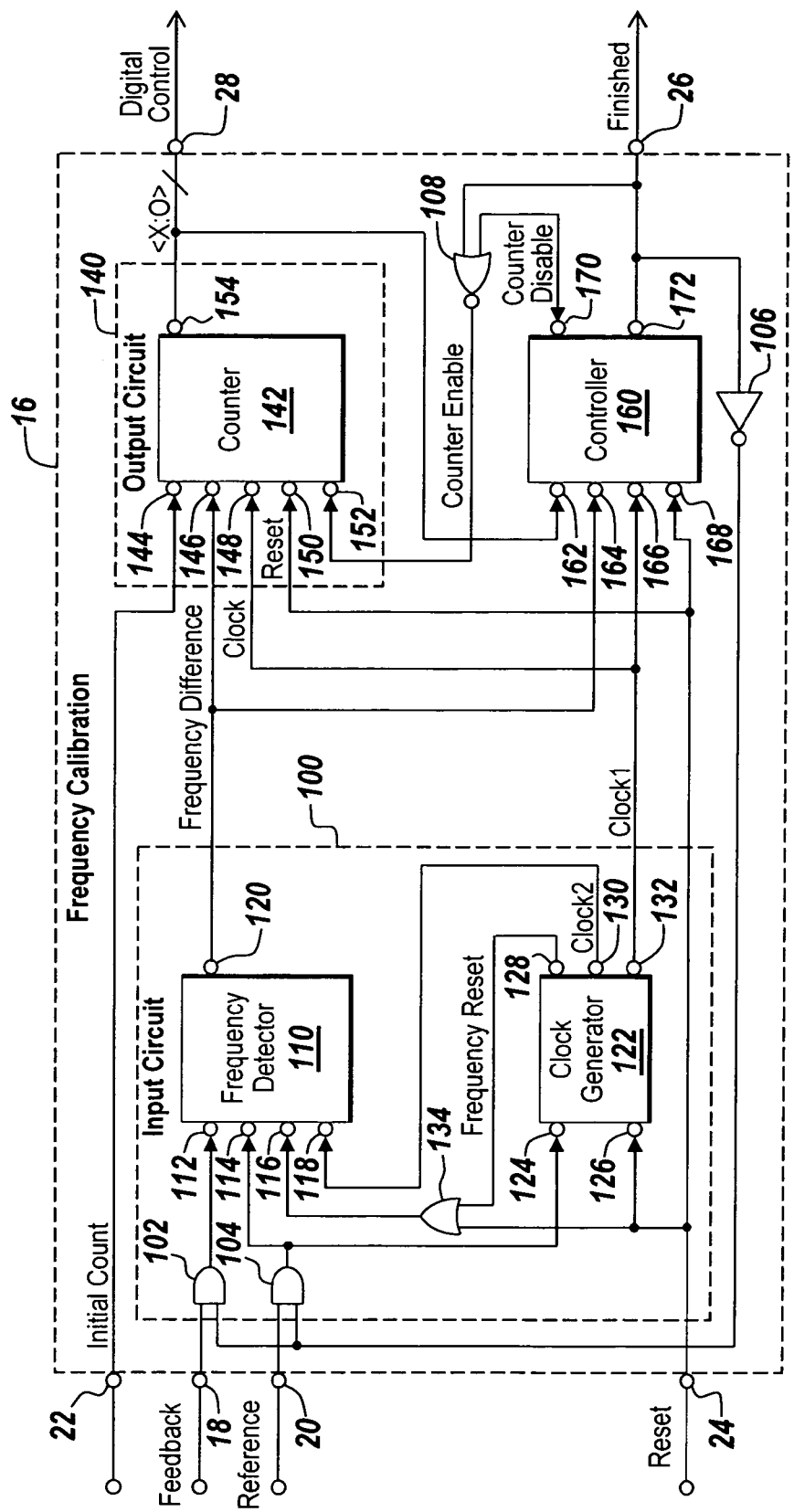
FIG. 2 illustrates a block diagram of the frequency calibration circuit in accordance with the teachings of the present invention.

FIG. 2 illustrates an exemplary block diagram of the frequency calibration circuit 16. The frequency calibration circuit 16 includes an input circuit 100, an output circuit 140, a controller 160, various logic gates, and other circuit elements. For example, AND gate 102, AND gate 104, NOR gate 108, OR gate 134, and inverter 106. Those skilled in the art will appreciate that various logic gate types are illustrated for explanatory purposes and other logic gate types are possible in place of those illustrated and that the various illustrated logic gates and other elements can be include within or as part of the various circuits forming the frequency calibration circuit 16. The input circuit 100 includes a frequency detector 110, a clock generator 122, and the logic gates 102, 104, and 134. The output circuit 140 includes a counter circuit 142.

The frequency detector 110 includes a first input node 112 to receive an enabled version of the feedback signal, a second input node 114 to receive an enabled version of the reference signal, a third input node 116 to receive a reset or initialize signal, and a fourth input node 118 to receive a clock signal labeled clock 2 generated by the clock generator 122. The frequency detector 110 includes an output node 120 to assert an output signal representing the polarity of the frequency difference between the feedback signal and the reference signal detected by the frequency detector 110. The output signal of the frequency detector 110 is labeled frequency difference.

The clock generator 122 includes a first input node 124 to receive the reference signal and a second input node 126 to receive the reset signal asserted on the fourth input node 24 of the frequency calibration circuit 16. The clock generator 122 includes a first output node 128 to assert a reset signal produced by the clock generator 122, a second output node 130 to assert the clock signal labeled clock 2 produced by the clock generator 122, and a third output node 132 to assert a clock signal labeled clock 1 produced by the clock generator 122.

The counter 142 includes a first input node 144 to receive an initial count signal initializing a count value of the counter 142 and a second input node 146 to receive the frequency difference signal generated by the frequency detector 110. The counter 142 includes a third input node 148 to receive the clock 1 clock generated by the clock generator 122, a fourth input node 150 to receive the reset signal or initialize signal asserted in the fourth input node 24 of the frequency calibration circuit 16, and a fifth input node 152 to receive a counter enable signal. The counter 142 includes an output node 154 to assert the digital control signal produced by the counter 142.

The controller includes a first input node 162 to receive the digital control signal produced by the counter 142, a second input node 164 to receive the frequency difference signal produced by the frequency detector 110, a third input node 166 to receive clock signal clock 1 produced by the clock generator 122, and a fourth input node 168 to receive the reset signal or initialize signal asserted on the fourth input node 24 of the frequency calibration circuit 16. The controller 160 includes a first output node 170 to output a counter disable signal produced by the controller 160 and a second output node 172 to output the finished signal produced by the controller 160. The finished signal indicates and controls when the VCO 68 enters the calibration mode and when the VCO 68 exits the calibration mode and enters the operational mode (i.e., when calibration is complete). The finished signal produced by the controller 160 is asserted on the second output node of the frequency calibration circuit 16 and is also inverted by the inverter 106 and gated with the feedback signal at gate 102 and gated with the reference signal at gate 104 to enable the feedback signal and the reference signal by the frequency detector 110. In this manor, when the controller 160 has determined the calibration of the VCO 68 is complete the controller 160 prevents the frequency detector 110 from receiving either the feedback signal or the reference signal to effectively disable the input circuit 100.

In operation, the input circuit 100 using the frequency detector 110 detects a frequency difference between the feedback signal and the reference signal and produces the output signal frequency difference to represent the polarity of the frequency difference between the two input signals. In turn, the counter 144 of the output circuit 140 uses that polarity indication signal to either increase, decrease, or leave a count value of the counter unchanged. The count value of the counter 142 is asserted on the output node 154 as the digital control signal to command the VCO 68 to add capacitance, remove capacitance, or leave the capacitance settings unchanged in order to shift, tune, or calibrate the oscillation frequency of the VCO 68.

The initial count signal received on the third input node 22 commands the counter 142 to an initial count value or loads the counter 142 with an initial count value. During calibration counter 142 increments or decrements the count value. The effect on the VCO 68 of an increment or decrement of the count value depends on the arrangement and resolution of the capacitor bank 70. For example, the counter 142 can increment or decrement the count value by one bit to result in a corresponding increase or decrease in the change of capacitance of 1 LSB plus or minus, respectively, on the capacitor bank 70. The maximum or minimum value of the count value or the size of the counter can be based on the range of frequency adjustment caused by the capacitor bank 70 on the VCO 68.

In the case of an LC VCO if the amount of capacitance is increased when the count of counter 142 increases and the amount of capacitance is decreased when the count decreases then when the frequency difference signal produced by the frequency detector 110 indicates that the frequency of the feedback signal is greater than the frequency of the reference signal the counter 142 should increment the count value. Likewise, when the frequency difference signal indicates that the frequency of the feedback signal is smaller than the frequency of the reference signal, the counter 142 decreases the count value. In the case of an LC VCO where capacitance of the capacitor bank 70 decreases when the count increases and capacitance of the capacitor bank 70 increases when the count decreases then when the frequency difference signal indicates that the frequency of the feedback signal is greater than the frequency of the reference signal the counter 142 should decrement the count value. Likewise, when the frequency difference signal indicates that the frequency of the feedback signal is smaller than the frequency of the reference signal the counter 142 should increase the count value.

The frequency detector 110 is configured to be resettable by either the reset signal received on the fourth input node 24 or reset by gating a frequency reset signal produced by the clock generator 122 with the reset signal received on the fourth input node 24. That is, the frequency detector 110 can be reset either by the master reset at node 24 or by the frequency reset signal out of the clock generator 110. While the master reset signal is used to define the state of all blocks at the beginning of the calibration operation the frequency reset signal resets the frequency detector 110 after every count of counter 142 that results in a frequency adjustment on the VCO. This resetting action prepares the frequency detector 110 to carry out the next frequency comparison between the feedback and the reference signals. Those skilled in the art will appreciate that in other embodiments of the present invention the frequency detector 110 is not reset after every count of the counter 142 that results in a frequency adjustment on the VCO.

The controller 160 in addition to enabling and disabling the clocks received by the frequency detector 110 at the inputs 112 and 114 also enables and disables the output circuit 140. The controller 160 produces a counter disable signal that is gated with the finished signal by gate 108 to enable or disable operation of the counter 142.

Figure 3:
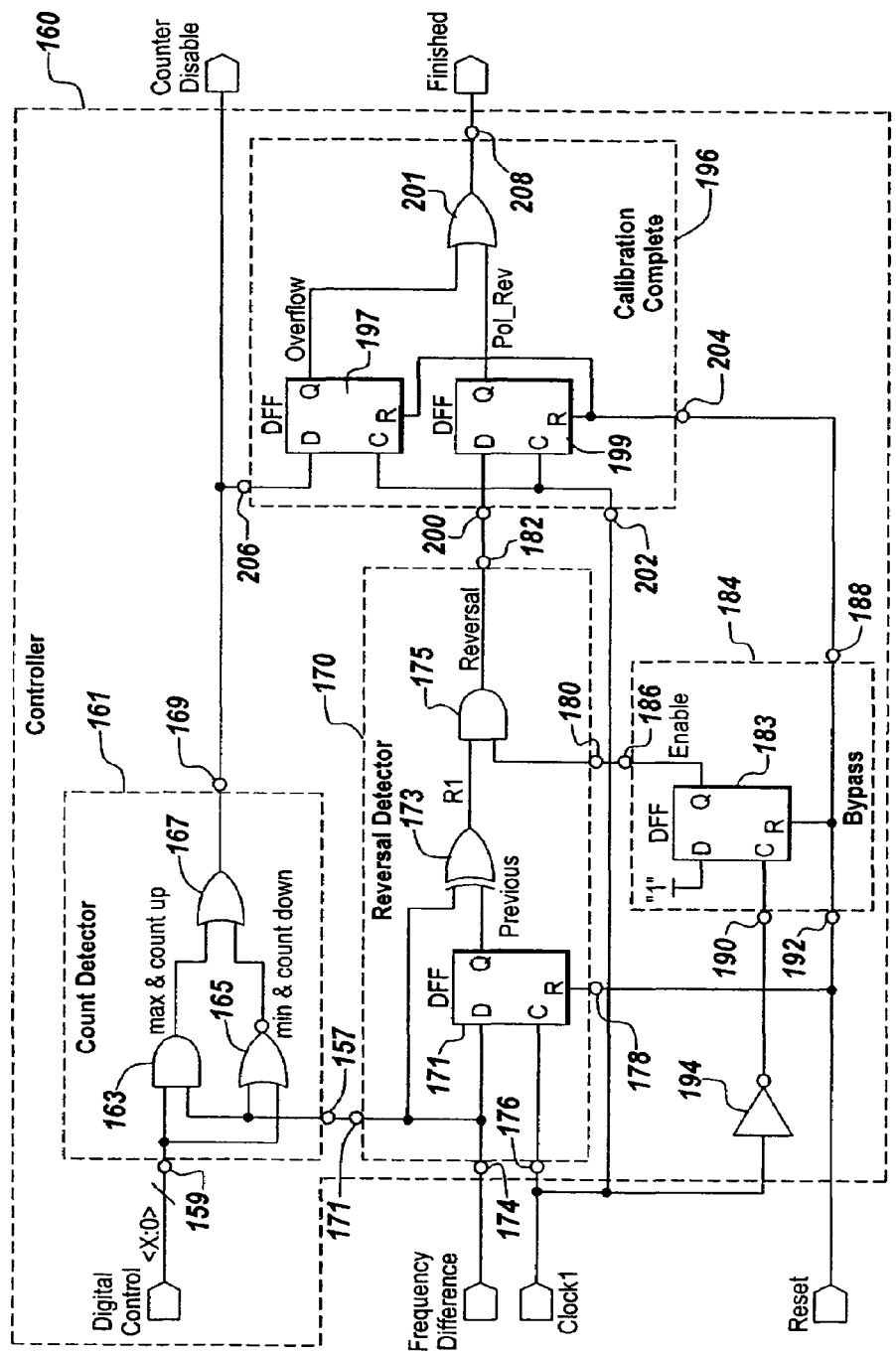
FIG. 3 illustrates a block diagram of the controller depicted in FIG. 2.

FIG. 3 illustrates the controller 160 in more detail. The controller 160 includes a count-limit detector 161, a reversal detector 170, a bypass circuit 184, and a calibration complete circuit 196.

The count-limit detector 161 includes a first input node 159 to receive the digital control signal produced by the counter 142 and a second input node 157 to receive the frequency difference signal produced by the frequency detector 110. The count limit detector 161 includes an output node 169 outputting its output signal.

In operation, the count-limit detector 161 receives the digital control signal and the frequency difference signal and determines from those two signals if the count value of the counter 142 is about to reach the maximum value or the minimum value. If the count-limit detector 161 detects the count value has reached the maximum value or the minimum value the count limit detector 161 produces a counter disable signal on the output node 169 to disable the counter 142 and drive a portion of the calibration complete circuit 196. The count limit detector 161 asserts the counter disable signal to disable the counter 142 to avoid an overflow condition in the counter 142. The count limit detector 161 is formable using an AND gate 163, a NOR gate 165, and an OR gate 167. The AND gate 163 has a first input coupled to the digital control signal and second input coupled to the frequency difference signal. The NOR gate 165 has a first input coupled to the frequency difference signal and a second input coupled to the digital control signal. The OR gate 167 has a first input coupled to the output of AND gate 163 and a second input coupled to the output to the NOR gate 165. The output of the OR gate 167 is coupled to output node 169 of the count limit detector 161. Those skilled in the art will appreciate the AND gate 163 is a multiple-input AND gate and the NOR gate 165 is a multiple-input NOR gate and their number of inputs, respectively, are equal to the number of bits at node 159 plus one.

The reversal detector 170 receives the frequency difference signal on a first input node 174, the clock 1 clock on a second input node 176, the reset signal on a third input node 178, and an enable signal on a fourth input node 180. The reversal detector 170 produces a reversal signal indicating that a reversal in count direction of the counter 142 has occurred. Those skilled in the art will appreciate the reversal detector 170 is configurable to produce the reversal signal indicating that a reversal in the count direction of the counter 142 is about to occur. The reversal signal is asserted on output node 182. The reversal detector 170 can include a second output node 171 to assert the frequency difference signal for use by the count limit detector 161. Those skilled in the art will appreciate the output node 172 is optional because the frequency difference signal can be provided directly to the count limit detector 161.

The reversal detector 170 is configured to include a flip-flop 171, an XOR gate 173, and an AND gate 175. The clock 1 clock signal clocks the flip-flop 171 and the flip-flop 171 is resettable by the reset signal. The flip-flop 171 holds a previous value of the frequency difference signal so that the XOR gate 173 receives as input the previous value of the frequency difference signal and the current value of the frequency difference signal and determines if the present and previous values of the frequency difference signal are different to detect a reversal in the direction of count of the counter 142 or in other words a count reversal. The AND gate 175 receives the output of the XOR gate 173 on a first input and receives an output of the bypass circuit 188 on a second input to determine if the reversal is allowable based on a state of the frequency calibration circuit 16.

That is, during the first cycle or iteration of calibrating the VCO 68 after initialization or reset of the frequency calibration circuit 16, the bypass circuit 184 forces the reversal signal to be low indicating that no reversal occurred and ignoring the decision of the reversal detector circuit 170. In this manner, a potential incorrect indication of reversal in count direction produced by initial conditions is ignored. That is, during the initial decision cycle after power-on or after a reset, there is no history on the count direction so that the reversal detector is then bypassed, however, thereafter (i.e., from the second decision cycle on) decisions of the reversal detector 170 are no longer bypassed and a reversal in the count direction indicates the oscillation frequency of the VCO 68 in calibration mode has reached the center or mid-frequency value and calibration is therefore finished or complete. The reversal detector 170 produces and outputs the reversal signal on the output node 182 to drive one portion of the calibration complete circuit 196.

The bypass circuit 184 includes a first input node 190 to receive an inverted clock 1 clock signal. An inverter 194 inverts the clock 1 clock signal. The bypass circuit 184 includes a second input node 192 to receive the reset signal to reset the bypass circuit 184. The bypass circuit 184 includes a first output node 186 to drive the second input of AND gate 175 and optionally includes a second output node 188 to provide the calibration complete circuit 196 with the reset signal. The bypass circuit 184 includes a flip-flop 183. The flip-flop 183 has its data input tied to a source providing a constant logic "1" value.

The calibration complete circuit 196 includes a first input node 200 to receive the reversal signal produced by the reversal detector 170, a second input node 202 to receive the clock 1 clock signal, a third input node 204 to receive the reset signal, and a fourth input node 206 to receive the counter disable signal produced by the count limit detector 161. The calibration complete circuit 196 includes an output node 208 to assert the finished signal produced by the calibration complete circuit 196.

The calibration complete circuit 196 is configured to include a first flip-flop 197, a second-flip-flop 199, and an OR gate 201. The first flip-flop 197 has its data input coupled to the output node 169 of the count limit detector 161 and produces an overflow signal based on the value of the counter disable signal. The second flip-flop 199 has its data input coupled to the output of the AND gate 175 to produce a polarity reversal signal. The OR gate 201 has a first input coupled to the output of the first flip-flop 197 or the overflow signal and a second input coupled to the output of the second flip-flop 199 or the polarity reversal signal to produce the finished signal on output node 208. In this manner, the calibration complete circuit 196 determines and indicates calibration is complete if the counter 142 has reached a maximum or minimum value, or if a direction of the count value has reversed or is about to reverse. The calibration complete circuit 196 re-times the counter disable signal and the reversal signal and asserts the finished signal if either of those two re-timed signals is asserted.

Those skilled in the art will appreciate the various circuits forming the controller 160 are depicted with certain gate types and certain flip-flop types and discussed in terms of one logic type. Nonetheless, present invention is not limited to the types of logic, gates, and sequential data storage elements discussed and other types of logic (i.e., inverse logic), gates, and sequential data storage elements are well suited for use in the present invention.

Figure 4:
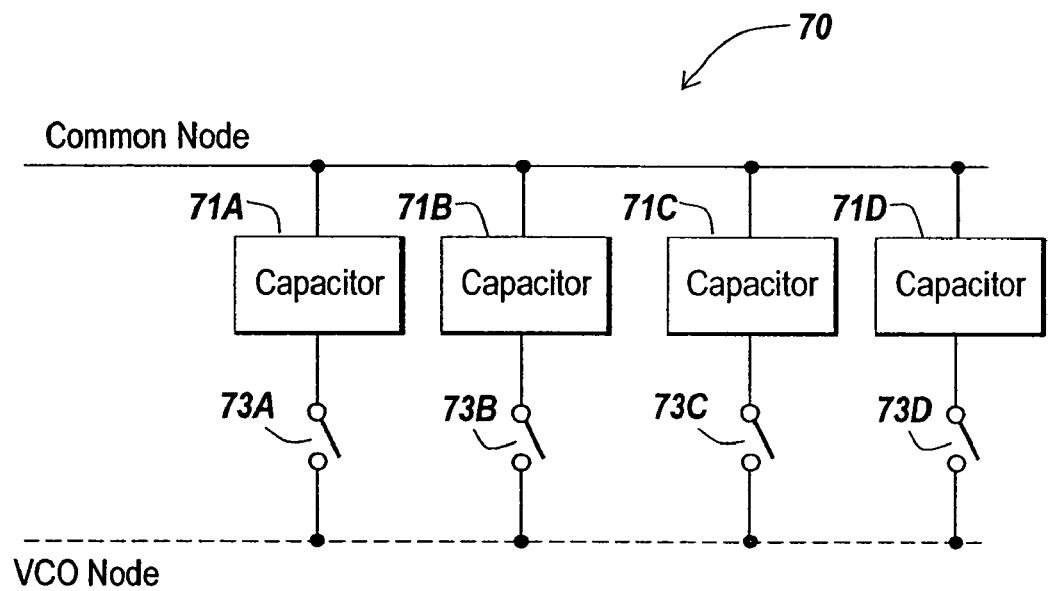
FIG. 4 illustrates a block diagram of a capacitor bank suitable for use in practicing the teachings of the present invention.

FIG. 4 depicts the capacitor bank 70 in more detail. The capacitor bank 70 includes a number of binary-weighted capacitors connected in parallel so that the addition or removal of a capacitor adds or subtracts from the overall capacitance value used to control the oscillation frequency of the VCO 68. Those skilled in the art will appreciate that although the capacitor bank 70 is illustrated as having capacitors connectable in parallel the capacitor bank 70 is configurable to include capacitors connectable in series or a combination of capacitors connectable in series and in parallel to adjust the capacitance value of the VCO 68 in order to calibrate the oscillation frequency of the VCO 68. The capacitor bank 70 includes a first capacitor 71A with a value of 1 unit in parallel with a second capacitor 71B a value of two units, which is in parallel with a third capacitor 71C with a value of 4 units, which is in parallel with a fourth capacitor 71D with a value of 8 units, which makes the capacitors binary weighted. The capacitor bank 70 also includes a first switch 73A operable to connect or disconnect the first capacitor 71A, and includes a second switch 73B operable to connect or disconnect the capacitor 71B, and includes a third switch 73C operable to connect or disconnect the third capacitor 71C, and includes a fourth switch 73D operable to connect or disconnect the fourth capacitor 71D.

The capacitor bank 70 can receive the digital control signal produced by the frequency calibration circuit 16 directly on input node 74 or indirectly through, for example a decoder. The value of the digital control signal defines the amount of capacitance in bank 70. Therefore, a change in the value of the digital control signal produces a change of capacitance in the capacitor bank 70 causing a frequency shift in the oscillation frequency of the VCO 68 to calibrate the VCO 68 in the digital domain.

Figure 5:
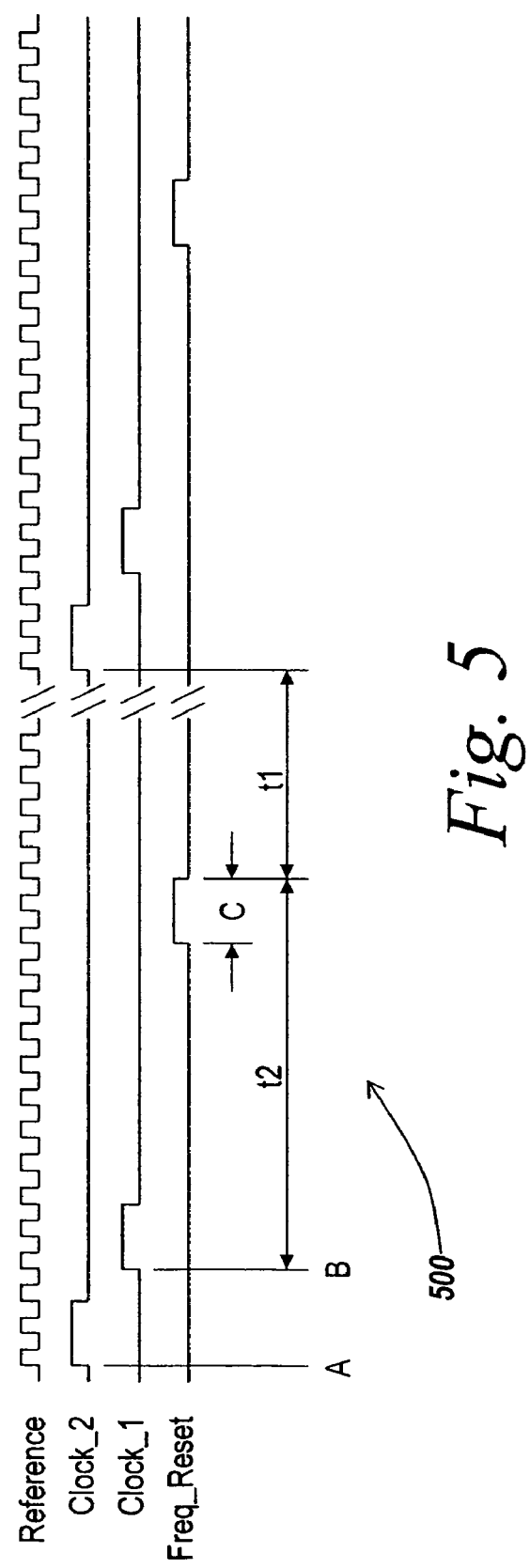
FIG. 5 illustrates a timing diagram suitable for practicing an illustrative embodiment of the present invention.

FIG. 5 depicts an exemplary timing diagram 500 of the three clocks used by the calibration circuit 16. Those skilled in the art will appreciate that those clocks are producible by several known techniques therefore no detail of how they are created is discussed in this document Diagram 500 illustrates the operation of the frequency calibration circuit 16. At time "A", the frequency detector 110 produces the frequency difference signal indicating whether the frequency of the feedback signal is faster than the frequency of the reference signal. At time "B" the counter 142 receives the rising edge of the clock 1 clock and if the counter enable signal is a logic "1" the counter 142 increments or decrements the count value it holds depending on the value of the frequency difference signal. Once the counter 142 increments or decrements the count value a corresponding adjustment to the frequency of VCO 68 is made. Time "t2" represents a suitable amount of time for the VCO frequency to settle after undergoing adjustment. For example, if the VCO frequency equals twenty times the frequency of the reference signal and "t2" equals twelve reference signal periods, the VCO 68 has two hundred forty (240) periods (i.e., 12×20) to settle. During time period "C", the clock generator 122 resets the frequency detector 110.

Time "t1" represents the time that the frequency detector 110 is operating in assessing whether the feedback signal or the reference signal has a higher frequency. If the frequency detector decision is based on the accumulation of one period of phase difference between the feedback and the reference signal then, for instance, each calibration frequency adjustment of the VCO 68 results in a 1% change in frequency difference between the feedback signal and the reference signal, then the frequency detector 110 would need at least one-hundred (100) periods to accumulate one period of the reference signal. Nonetheless, to provide margin and to account for starting conditions, the frequency detector 110 is allowed two-hundred (200) periods to make a decision. This period allows the frequency detector 110 to have a resolution of 0.5%. Similarly, if each calibration step causes a 0.5% change in frequency between the feedback and the reference signals then 200 cycles of the reference signal would be the minimum number required by the frequency detector 110 to make a decision. However, to provide sufficient margin twice the number of periods or four-hundred (400) periods are given to the frequency detector 110 to make a decision giving it a resolution of 0.25%. In this case, "t1" is equal to 400 reference periods.

Figure 6A:
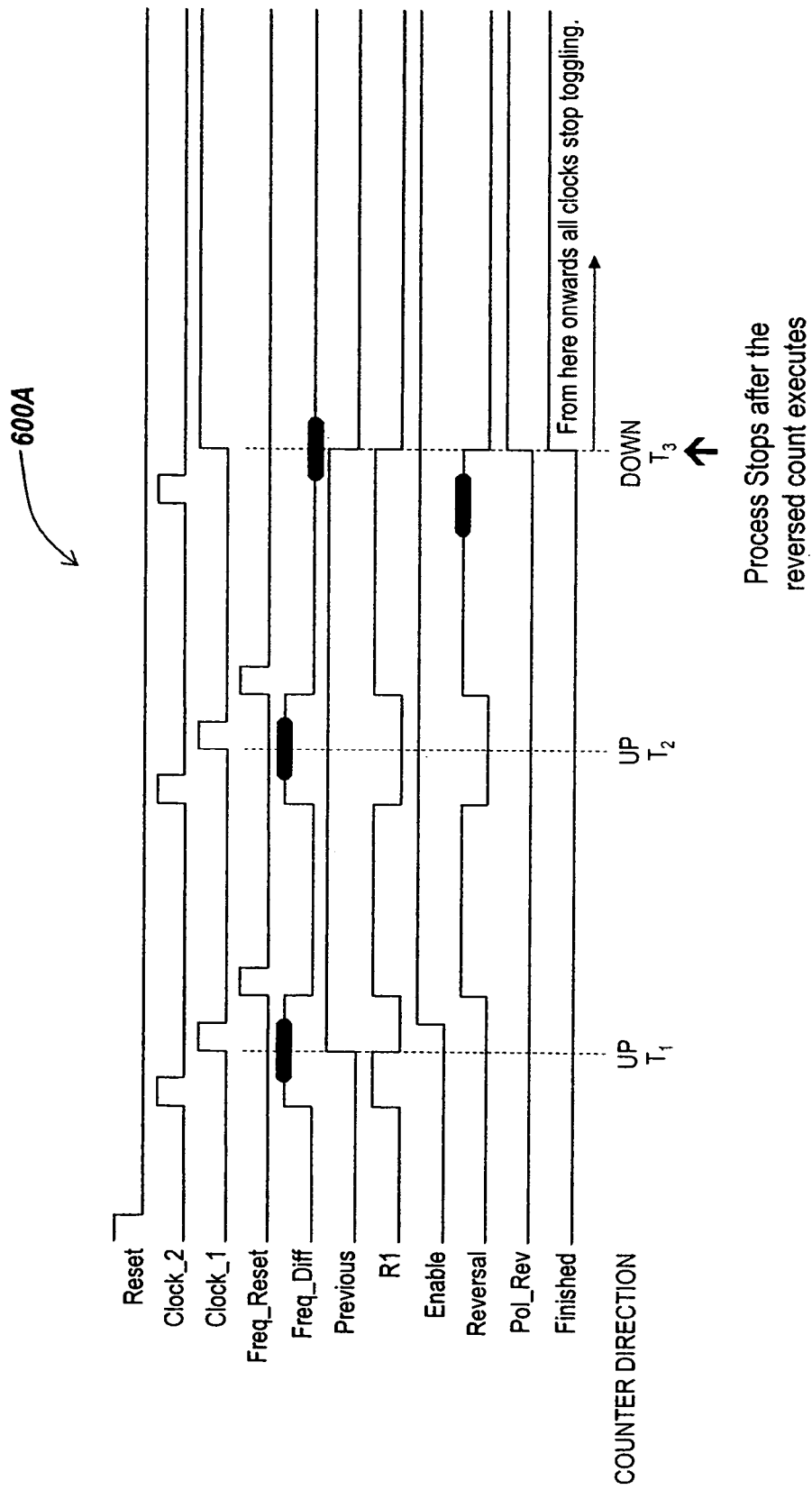
FIG. 6A illustrates a timing diagram depicting completion of calibration of an analog oscillator in accordance with one embodiment of the present invention.

FIG. 6A depicts a timing diagram illustrating an exemplary timing relationship amongst the operations of the frequency calibration circuit 16 and the calibration of an analog oscillator such as the VCO 68 in the digital domain. The timing diagram 600A illustrates the operation of the controller 160 of the frequency calibration circuit 16 to halt the calibration process due to the detection of a polarity reversal of the count value or the detection of a potential polarity reversal of the count value by the reversal detector 170. As depicted at time "$T_1$", the finish signal is at a logic level "0" and the frequency detector 110 asserts the frequency difference signal having a logic "1" level to instruct the counter 142 to increment the count value it holds. In turn the counter 142 increments the count value. Likewise, at time "$T_2$" the frequency detector 110 detects the frequency difference between the feedback signal and the reference signal and produces the frequency difference signal with a logic "1" value to instruct the counter 142 to increment the count value it holds. In turn, the counter 142 increments the count value it holds and produces the digital control signal having a value representative of the amount of capacitance that determines the frequency of the VCO 68.

However, at time "$T_3$" the frequency detector 110 detects a change in polarity in the frequency difference between the feedback signal and the reference signal and, in turn, produces the frequency difference signal having a logic "0" value, when previously, the frequency difference signal had a logic "1" value. As such, the reversal detector 170 detects a change in the polarity of the current value of the frequency difference signal from the previous value of the frequency difference signal at time "$T_2$" and causes the reversal signal to have a logic "1" value at the time when clock 1 rises, which is when that signal is latched and translated into the finished signal. Notice that, during this calibration cycle, the bypass circuit 184 does not override or bypass the reversal indication by the reversal detector 170 because at time "$T_3$" the calibration process has gone beyond the first calibration cycle. Because of the reversal detection by the reversal detector 170, the controller 160 toggles the finish signal to halt clock generation by the clock generator 122 and to block receipt of the feedback signal and the reference signal by the frequency detector 110. Toggling of the finish signal halts the calibration process of the VCO 68.

Figure 6B:
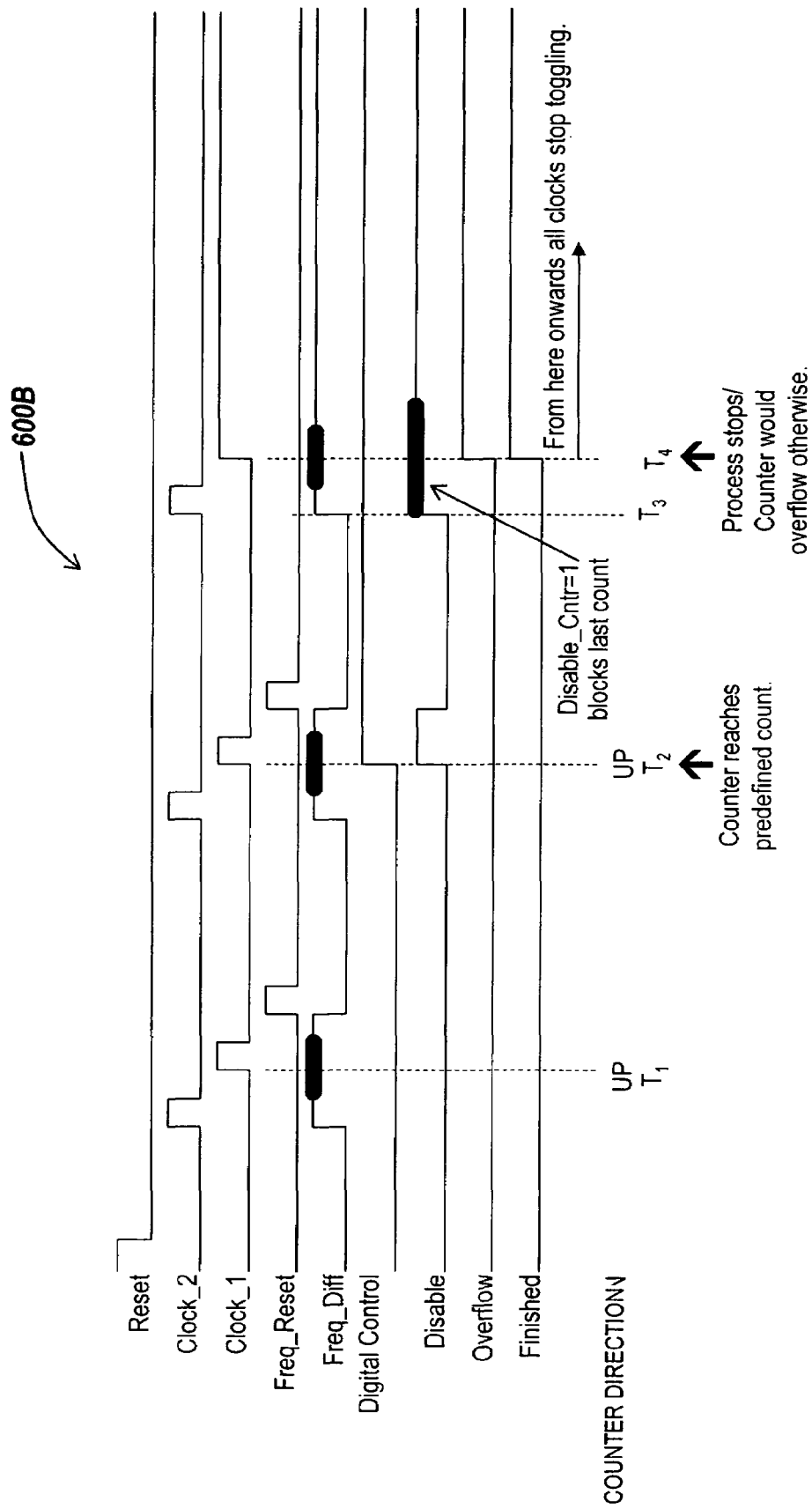
FIG. 6B illustrates a timing diagram depicting completion of calibration of an analog oscillator in accordance with one embodiment of the present invention.

FIG. 6B depicts another exemplary timing diagram representing the control of the calibration process of an analog oscillator in the digital domain by the frequency calibration circuit 16. Timing diagram 600B represents the operations and the interaction of the operations amongst the components forming the frequency calibration circuit 16 to halt the calibration process of the analog oscillator in the digital domain once the count value of the counter 142 reaches a maximum value. As illustrated, around time "$T_1$", the frequency detector 110 detects the polarity of the frequency difference between the feedback signal and the reference signal and produces the frequency difference signal having a logic "1" value to instruct the counter 142 to increment the count value it holds. In turn, the counter 142 increases the count value and produces the digital control signal representing the amount of capacitance in the VCO 68. Around time "$T_2$", the frequency detector 110 detects the polarity of the frequency difference between the feedback signal and the reference signal and produces the frequency difference signal having a logic "1" value. In turn, the counter 142 increases its count value at which point it reaches the maximum value as indicated by the LSB of the digital control signal transitioning from a logic "0" value to a logic "1" value and all the bits that form the digital control signal are at a logic "1" value. Halting of the calibration process doe not occur at this time because although the maximum count is reached the counter 142 has not overflowed. At time "$T_3$", the rising edge of clock 2 causes the frequency difference signal to indicate that the count should be increased, but the counter 142 had already reached its maximum count at time "$T_2$", as indicated by the digital control signal having a logic "1" value. In turn, the count-limit detector 161 forces the counter disable signal to a logic "1" value, which disables counter 142 preventing it from changing the count value when clock 1 rises at "$T_4$" otherwise counter 142 overflows.

In turn, the calibration complete circuit 196 detects the level change in the disable signal and interprets the level change as calibration of the analog oscillator as being complete. The calibration complete circuit 196 produces the finish signal having a logic "1" level to indicate calibration is complete. As such, the finish signal disables the frequency detector 110 and the finish signal in combination with the disable signal, disable the counter 142 and at time "$T_4$" the clock generator 122 halts clock signals clock 1 and clock 2 thereafter halting calibration of the VCO 68.

Those skilled in the art will appreciate the timing diagrams 600A, 600B are illustrative, the period between events can be shortened or lengthened as desired, and the logic levels used to indicate the occurrence of certain events can be based on inverse logic.

Figure 7A:
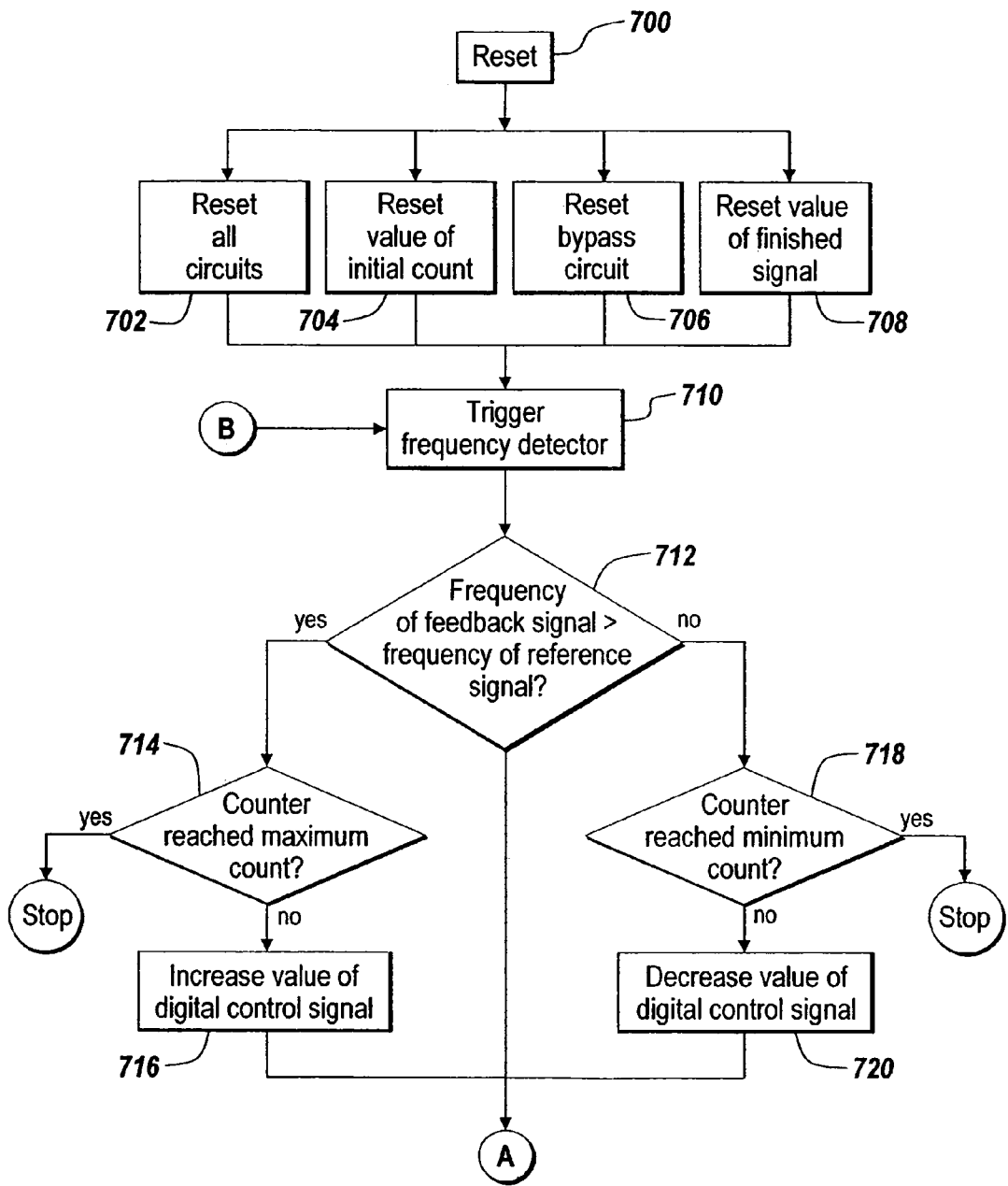
FIGS. 7A & 7B depict steps taken to practice an illustrative embodiment of the present invention.
Figure 7B:
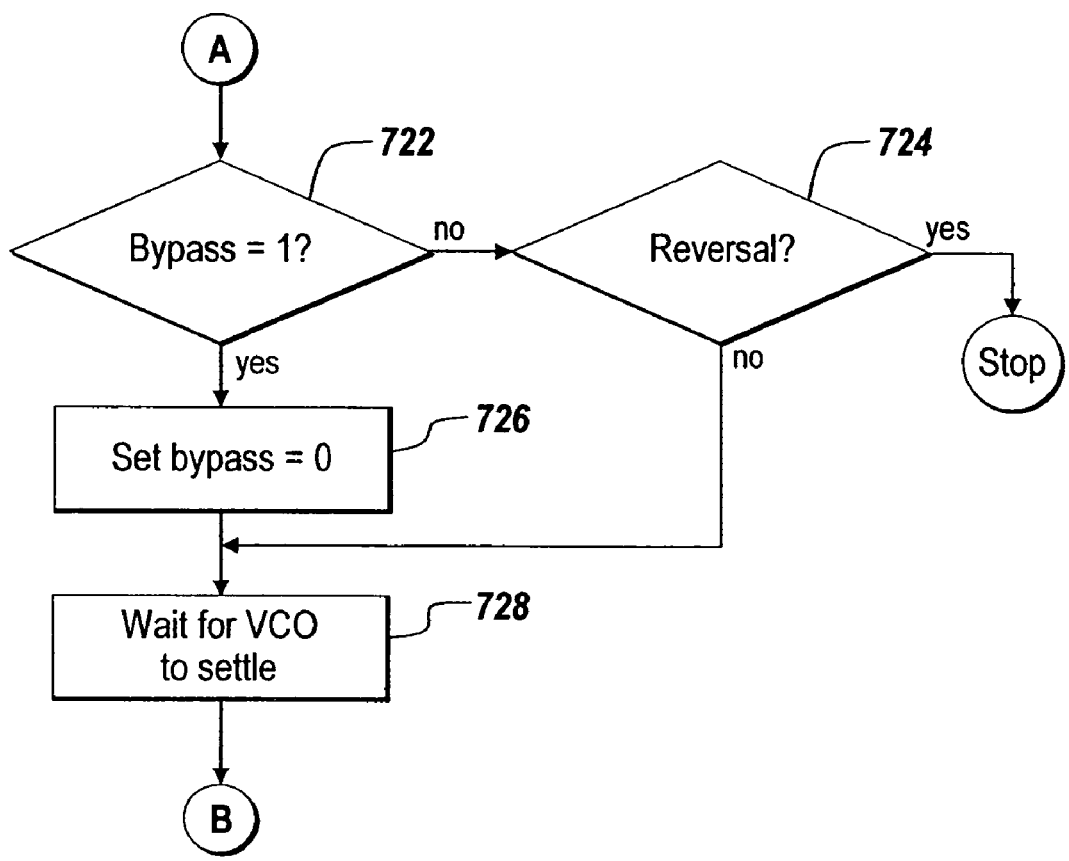

FIGS. 7A and 7B illustrate steps taken by the frequency calibration circuit 16 to calibrate or center a frequency of oscillation of an analog oscillator such as the VCO 68 in the digital domain. The steps taken to calibrate an analog oscillator as depicted in FIGS. 7A and 7B are discussed in relation to FIGS. 1, 2, 3, 6A and 6B.

In step 700, the frequency calibration circuit 16 is initialized or reset by an initialization signal or reset signal received on the fourth input node 24. In step 702, the various circuits forming the calibration circuit 16 are initialized or reset. In step 704, the initial count of the counter 142 is initialized or reset and in step 706, the bypass circuit 184 is initialized or reset. Further, in step 708, the calibration complete circuit 196 is initialized or reset to reset the finished signal. The initialization or reset in step 700 is responsible for the initialization or reset in steps 702, 704, 706 and 708.

In step 710, the frequency detector 110 triggers to detect the polarity of the frequency difference between the feedback signal and the reference signal. In step 712, the frequency detector 110 determines the polarity. If the frequency of the feedback signal is greater than the frequency of the reference signal, operation proceeds to step 714. In step 714, the controller 160 determines if the counter 142 has reached a maximum count value. If the counter 142 has reached the maximum count value, the calibration procedure halts. If the count value of the counter 142 has not reached the maximum value then in step 716, the counter 142 increments the count value and increments the value of the digital control signal produced by the counter 142.

If at step 712, the frequency of the feedback signal is less than the frequency of the reference signal, the controller 160 determines at step 718, if the count value of the counter 142 has reached a minimum value. If the count value of the counter 142 has reached the minimum value, the calibration process halts. If the count value of the counter 142 has not reached the minimum value, the operation proceeds to step 720. In step 720, the counter 142 decrements the count value and, in turn, decrements the value of the digital control signal. After either incrementing or decrementing the value of the digital control signal, the process proceeds to step 722.

In step 722, it is determined if the bypass value is set to a logic "1" value. If the bypass value equals a logic "1" value the of reversal of polarity detection is bypassed, and in step 726, the bypass value is set to a logic "0" value to prevent bypassing a polarity value reversal in future calibration cycles until the frequency calibration circuit 16 is reset or initialized. With the bypass value equal to a logic "1" value such a value indicates the frequency calibration circuit 16 is in the first cycle of operation and allows the counter 142 to count in any direction. Once bypass has a logic "1" value, a reversal of polarity of the count is an indication the calibration process of the analog oscillator circuit is complete. If at step 722, the bypass value equals a logic "0" value then in step 724, it is determined whether a polarity reversal of the count occurred. If a polarity reversal of the count occurred, the calibration process halts or stops. If no polarity reversal occurred, the process proceeds to step 728.

In step 728, the frequency calibration circuit 16 enters a wait state to allow the VCO 68 to settle and at completion of the wait state loops back to step 710 to begin the process again until either the maximum count value is reached, the minimum count value is reached, or a polarity reversal in the count is detected.

While the present invention has been described with reference to a preferred embodiment thereof, one skilled in the art will appreciate various changes in form and detail may be made without departing from the intended scope of the present invention as defined in the pending claims. The logic "0" values referred to throughout this text refers to a voltage level that represents the low value of a digital signal and the logic "1" levels referred to through out this text refers to the high value of a digital signal. The actual voltage levels corresponding to "0" and "1" or low and high would depend on specific application and implementation.

What is claimed is:

1. A Phase Locked Loop (PLL) circuit comprising,
    a Voltage Controlled Oscillator (VCO) responsive to a digital control signal received on a first input node to set a frequency of the VCO to correspond to a mid-range voltage of an analog control signal received on a second input node; and
    a frequency calibration circuit responsive to a plurality of input signals received on a plurality of input nodes to drive an output node with the digital control signal to set the frequency of the VCO, the frequency calibration circuit comprising:
        a frequency detector to detect a frequency difference between a feedback signal and a reference signal and drive an output node with an output signal representative of the detected frequency difference;
        a counter responsive to the output signal of the frequency detector to generate and output the digital control signal;
        a controller configured to control a calibration process of the VCO; and
        a clock generator configured to generate a first clock to clock the controller and to generate a second clock to clock the frequency detector;
    wherein a change in the digital control signal represents a frequency shift to set the frequency of the VCO.

2. The PLL of claim 1 further comprising,
    a frequency divider to divide a frequency of an output signal of the VCO and drive an output node with a feedback signal representative of the divided frequency of the output signal;
    a phase-frequency detector to detect any of a frequency difference between the feedback signal and a reference signal or a phase difference between the feedback signal and the reference signal, and generate an output signal at either a first output node or a second output node related to any of the frequency difference or the phase difference between the feedback signal and the reference signal; and
    a charge-pump having a first input node to receive the output signal driven by the phase-frequency detector on the first output node and a second input node to receive the output signal drive by the phase-frequency detector on the second output node and in response to the output signal from the first output node sources current and in response to the output signal from the second output node sinks current to generate an output charge current proportional to the phase difference detected by the phase-frequency detector.

3. The PLL of claim 2 further comprising, a loop filter configured to convert the charge-pump current into the analog control voltage signal.

4. The PPL of claim 1 further comprising, a switch configured to switch the VCO between a calibration mode and an operational mode.

5. The PLL of claim 1, wherein a value the digital control signal increases when a frequency of the feedback signal is greater than a frequency of the reference signal.

6. The PLL of claim 1, wherein a value of the digital control signal decreases when a frequency of the feedback signal is less then a frequency of the reference signal.

7. The PLL of claim 1, wherein a value of the digital control signal increases when a frequency of the reference signal is greater than a frequency of the feedback signal.

8. The PLL of claim 1, wherein the value of the digital control signal decreases when a frequency of the reference signal is less than a frequency of the feedback signal.

9. A Phase Locked Loop (PLL) circuit comprising,
    a Voltage Controlled Oscillator (VCO) responsive to a digital control signal received on a first input node to set a frequency of the VCO to correspond to a mid-range voltage of an analog control signal received on a second input node; and
    a frequency calibration circuit responsive to a plurality of input signals received on a plurality of input nodes to drive an output node with the digital control signal to set the frequency of the VCO, the frequency calibration circuit comprising:
        a frequency detector to detect a frequency difference between a feedback signal and a reference signal and drive an output node with an output signal representative of the detected frequency difference;
        a counter responsive to the output signal of the frequency detector to generate and output the digital control signal; and
        a controller configured to control a calibration process of the VCO, the controller, comprising a count detector configured to disable the counter when the value of the digital control signal reaches a predefined value;

wherein a change in the digital control signal represents a frequency shift to set the frequency of the VCO.

10. The PLL of claim 9, wherein the controller further comprises, a reversal detector configured to detect a reversal of polarity of the frequency difference between the feedback and the reference signals.

11. The PLL of claim 10 wherein the controller further comprises, a bypass circuit configured to bypass an output of the reversal detector.

12. The PLL of claim 11 wherein the controller further comprises, a calibration complete circuit configured to detect when the calibration of the VCO completes.

13. A method for calibrating a voltage controlled oscillator (VCO), the method comprising the steps of:
   detecting a frequency difference between a frequency of a feedback signal of the VCO and a frequency of a reference signal;
   changing a count of a counter based on the frequency difference;
   halting calibration of the VCO when any of the following occur: the count equals a predetermined value; when the change to the count causes a reversal in a count direction of the counter, or when the change to the count would cause a reversal in a count direction of the counter; and
   disabling the counter when the value of the digital control signal reaches a predefined value.

14. The method of claim 13 further comprising the step of, changing a capacitance value of the VCO based on the count of the counter.

15. The method of claim 13, wherein the step of detecting detects a polarity of the frequency difference between the frequency of the feedback signal of the VCO and the frequency of the reference signal.

16. The method of claim 13 further comprising the step of, bypassing the step of halting.

17. A calibration circuit for calibrating an analog oscillator circuit in a digital domain, the calibration circuit comprising:
   an input circuit to initiate calibration of the analog oscillator circuit in the digital domain and output a digital output signal representing a result of a comparison between a frequency of a reference signal received on a first input node and a frequency of a feedback signal from the analog oscillator circuit received on a second input node;
   an output circuit responsive to the digital output signal to change a digital value of a calibration signal generated by the output circuit, the change in the value of the calibration signal changing an electrical characteristic of the analog oscillator circuit from the digital domain to calibrate the analog circuit;
   a controller configured to halt calibration when either the value of the calibration signal reaches a predetermined value, a change in direction of a binary count occurs, or a change in direction of a binary count would occur, wherein a value of the binary count is represented by the calibration signal; and
   a clock generator configured to generate a first clock to clock the controller and to generate a second clock to clock the input circuit.

* * * * *